(12) United States Patent
Khonsari et al.

(10) Patent No.: US 11,488,420 B2
(45) Date of Patent: Nov. 1, 2022

(54) DAMAGE ASSESSMENT

(71) Applicants: Michael M. Khonsari, Baton Rouge, LA (US); Lijesh Koottaparambil, Baton Rouge, LA (US)

(72) Inventors: Michael M. Khonsari, Baton Rouge, LA (US); Lijesh Koottaparambil, Baton Rouge, LA (US)

(73) Assignee: Board af Supervisors af Louisiana State University and Agricultural and Mechanical College, Baton Rouge, LA (US)

( * ) Notice: Subject to any disclaimer, the term of this patent is extended or adjusted under 35 U.S.C. 154(b) by 159 days.

(21) Appl. No.: 16/887,330

(22) Filed: May 29, 2020

(65) Prior Publication Data
US 2020/0382022 A1   Dec. 3, 2020

Related U.S. Application Data

(60) Provisional application No. 62/854,642, filed on May 30, 2019.

(51) Int. Cl.
| | |
|---|---|
| G07C 3/00 | (2006.01) |
| G01M 13/00 | (2019.01) |
| G01R 31/34 | (2020.01) |
| G01M 13/04 | (2019.01) |
| H02K 15/00 | (2006.01) |

(Continued)

(52) U.S. Cl.
CPC .............. *G07C 3/00* (2013.01); *G01R 31/34* (2013.01); *G05B 19/4065* (2013.01); *H02K 2215/00* (2021.08); *H02N 1/002* (2013.01); *H02N 1/04* (2013.01); *H02N 11/002* (2013.01)

(58) Field of Classification Search
CPC ........ H02N 1/00; H02N 1/002; H02N 11/002; G01M 99/007; G01M 13/04; G01M 99/00; G01M 13/00; H02K 2215/00; G01R 31/343; G01R 31/34
See application file for complete search history.

(56) References Cited

U.S. PATENT DOCUMENTS

| | | | | |
|---|---|---|---|---|
| 4,340,886 A | * | 7/1982 | Boldt | G01K 3/005 374/E1.019 |
| 5,210,704 A | * | 5/1993 | Husseiny | G01H 1/003 706/912 |

(Continued)

OTHER PUBLICATIONS

L.Liu et al. "Related Entropy Theories Application in Condition Monitoring of Rotating Machineries" Entropy 2019, 21(11), 1061; https://doi.org/10.3390/e21111061 (Year: 2019).*

(Continued)

*Primary Examiner* — Burton S Mullins
(74) *Attorney, Agent, or Firm* — John B. Edel; Edel Patents LLC

(57) ABSTRACT

Methods of estimating tribological damage described herein include examples where varying power is applied between surfaces engaged in frictional contact. Calculations evaluate power consumed at the relevant frictional contact and temperature values may be gathered to supplement the calculated power. Instantaneous and cumulative assessments of damage are calculated based on that information. Measurements or calculations of electrical power may be used as part of the damage assessment.

14 Claims, 7 Drawing Sheets

(51) Int. Cl.
    *G05B 19/4065*     (2006.01)
    *H02N 1/04*     (2006.01)
    *H02N 11/00*     (2006.01)
    *H02N 1/00*     (2006.01)

(56) References Cited

U.S. PATENT DOCUMENTS

| | | | | |
|---|---|---|---|---|
| 6,567,752 B2 * | 5/2003 | Cusumano | ........... | G01R 31/343 702/34 |
| 6,651,012 B1 * | 11/2003 | Bechhoefer | ........... | G01N 29/46 455/431 |
| 6,829,515 B2 * | 12/2004 | Grimm | ........... | G07C 3/00 700/170 |
| 6,845,306 B2 * | 1/2005 | Henry | ........... | G07C 5/085 701/29.6 |
| 7,318,007 B2 * | 1/2008 | Barkhoudarian | ........... | G01H 1/003 702/184 |
| 7,603,220 B2 * | 10/2009 | Jaeggle | ........... | F16D 48/06 477/6 |
| 7,882,394 B2 * | 2/2011 | Hosek | ........... | G06F 11/008 714/48 |
| 7,914,250 B2 * | 3/2011 | Behera | ........... | G05B 23/0283 415/118 |
| 8,810,396 B2 * | 8/2014 | Hedin | ........... | G01M 13/045 340/686.2 |
| 9,222,865 B2 * | 12/2015 | Khonsari | ........... | G01N 3/34 |
| 9,476,815 B2 * | 10/2016 | Khonsari | ........... | G01N 3/32 |
| 10,677,685 B2 * | 6/2020 | Thomson | ........... | G05B 23/0283 |
| 10,935,001 B2 * | 3/2021 | Hasan | ........... | F03D 7/0264 |
| 2011/0123331 A1 * | 5/2011 | Stiesdal | ........... | F03D 7/043 416/1 |
| 2018/0292465 A1 * | 10/2018 | Osara | ........... | G01N 33/2888 |
| 2020/0249130 A1 * | 8/2020 | Liu | ........... | F16C 25/06 |
| 2020/0310397 A1 * | 10/2020 | Hande | ........... | G05B 19/41885 |

OTHER PUBLICATIONS

M. Amiri et al. "On the Thermodynamics of Friction and Wear—A Review" Entropy 2010, 12(5), 1021-1049; https://doi.org/10.3390/e12051021 (Year: 2010).*

Saleh Akbarzadeh, M. M. Khonsari; On the Applicability of Miner's Rule to Adhesive Wear; Tribol Lett (2016) 63:29.

* cited by examiner

DAMAGE ASSESSMENT

This application claims the benefit of provisional application No. 62/854,642 filed on May 30, 2019 and entitled Cumulative Damage Assessment.

Damage assessment methods described herein may be used in the assessment of mechanical damage. Certain damage assessment methods disclosed herein may be used to evaluate instantaneous mechanical damage and certain damage assessment methods may evaluate cumulative mechanical damage. The damage assessments described herein may have particular utility in assessing damage associated with frictional wear.

FIRST EXAMPLE SET

Embodiments described herein may provide reliable information on the life expectancy of components experiencing frictional wear and may offer large economic benefits to industry by avoiding forced shutdowns that, aside from the loss of valuable assets, can cause serious environmental impacts.

Methods described herein may evaluate degradation and damage accumulation on the surface, which manifests itself in the form of wear. Numerous experiments were conducted to verify the methodology. Embodiments described herein were tested to ensure functionality. Briefly, the method utilizes the values of the power and entropy to determine the system degradation and alarm the looming failure of tribo-pairs based on any given conditions irrespective of their sliding speed and applied load. Power is determined from the product of friction force and sliding velocity while entropy is determined by dividing power by temperature.

Figure 1:
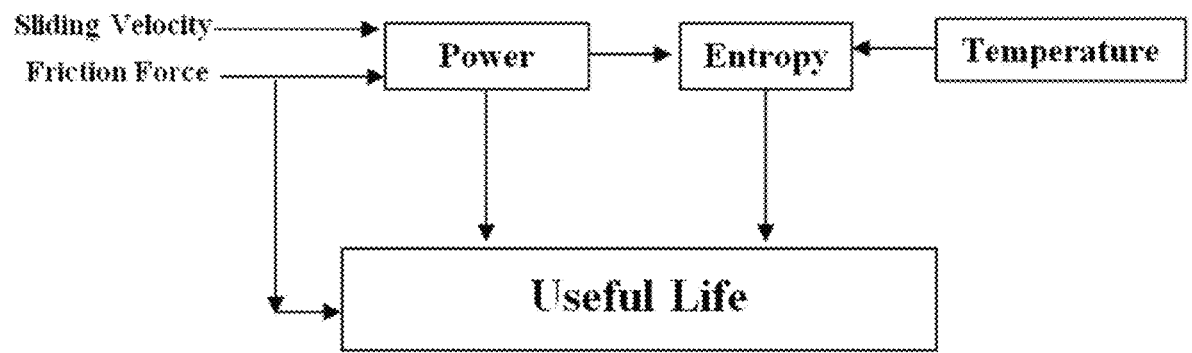
FIG. 1 shows a schematic representation of a disclosed method.

Disclosed embodiments predict the remaining useful wear life of components by measuring the power (based on the first law of thermodynamics), entropy (based on the second laws of thermodynamics) and friction force during the experiment. This invention can alert the operator of a looming danger to safety by sounding an alarm or automatically shutting down the system before failure so that proper measures can be taken to safely bring the system back online. A simplified schematic representation of the methodology is provided in FIG. 1

Figure 2:
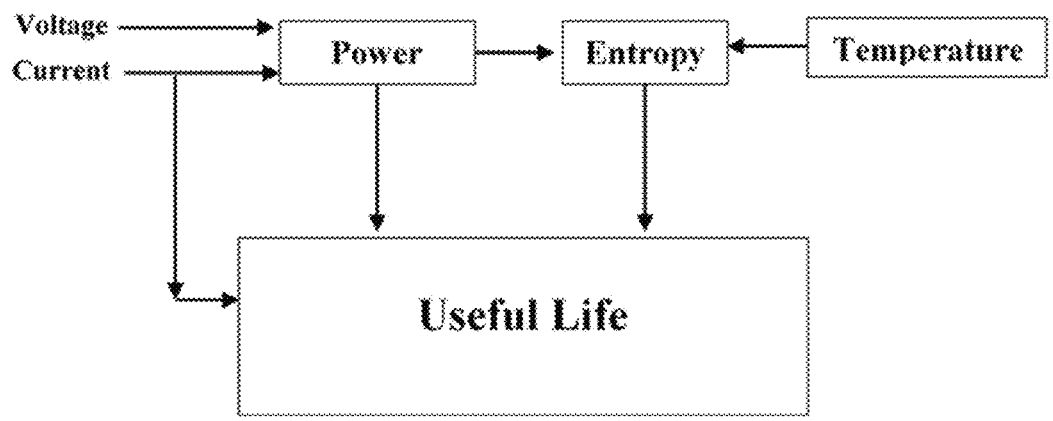
FIG. 2 shows a schematic representation of a disclosed method.

Measuring the friction force in an operational system requires a load cell and such methods have limited practical use. Installation of a load cell inside an existing machine may be difficult due to many physical restrictions such as space limitations and interference with other internal machine parts. Further, the data acquisition needed for reading and monitoring the load cell's output is not a trivial undertaking for machine operators particularly when there are multiple interconnected machines operating in series or parallel configurations. In this regard, a simple and economical method is describe for correlating the friction force of a system to the power consumed by the driving system and thereafter determining the useful life of the components. A damage rate having the dimensional characteristics of entropy is calculated by dividing the determined power by the measured temperature. A schematic representation of the methodology is provided in FIG. 2. The combination of power and entropy utilizes both laws of thermodynamics to provide a fail-safe monitoring system.

The power can be calculated by measuring the current and voltage consumed with time using a current sensor and a voltage sensor. To evaluate the damage rate having the dimensional characteristics of entropy, the temperature is either theoretically determined or measured using a thermocouple, resistance temperature detector (RTD), etc. Certain established methodologies may enable one to estimate the contact temperature depending on different configurations. In gears and rolling element bearings, for example, simple line-contact and formulas for estimating temperature are available. In ball bearings, it is a point contact and again it is possible to reliably estimate the temperature for the purposes of calculating a damage rate having the dimensional characteristics of entropy.

Figure 3:
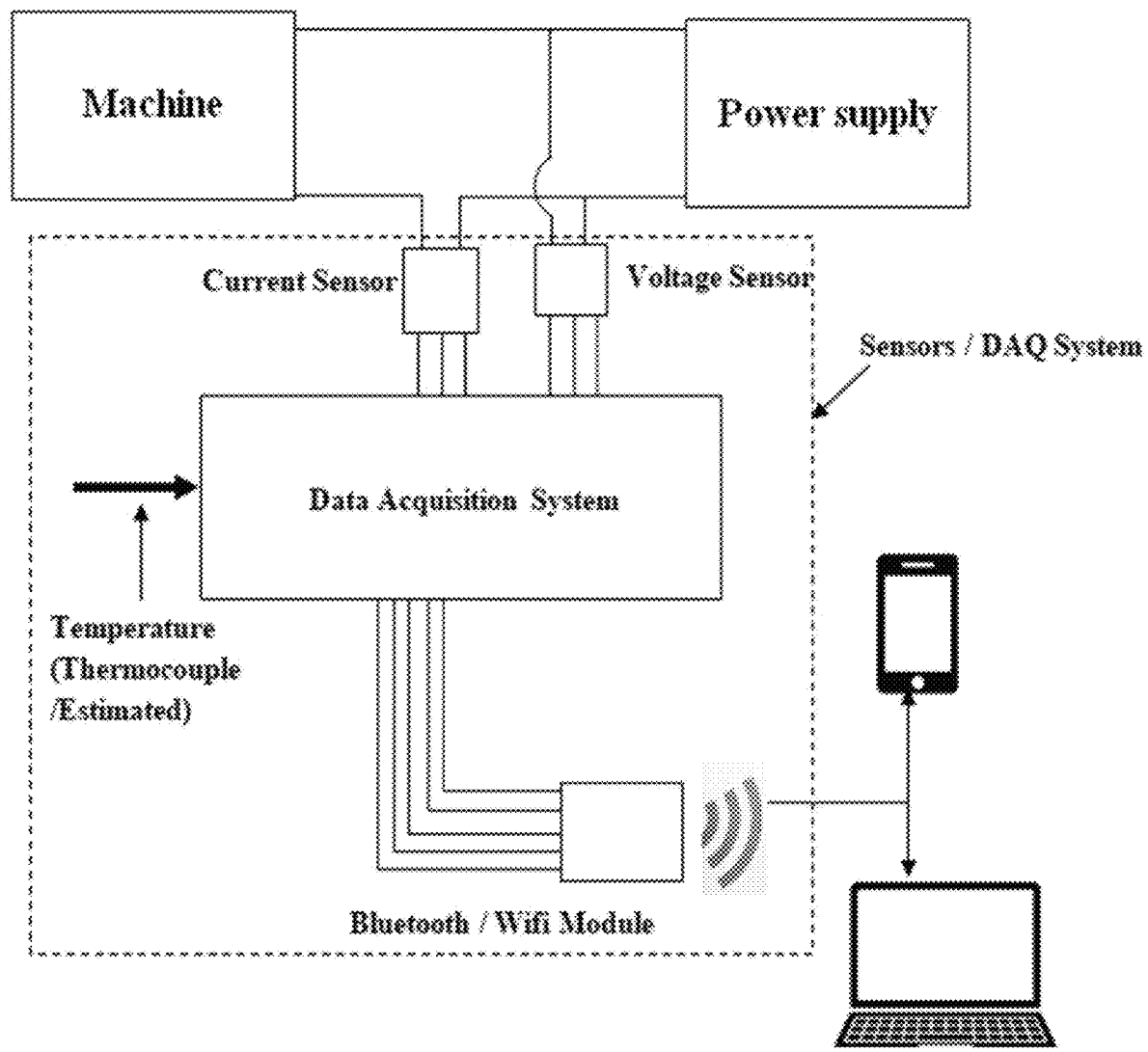
FIG. 3 shows a schematic representation of a damage monitoring system.

A schematic representation of an embodiment of a system for monitoring damage is shown in FIG. 3. The system comprises a machine with components whose useful life is to be determined. The system is capable of working with different types of sensors, e.g. current, voltage, thermocouple and wireless communication equipment such as Wifi and Bluetooth modules and a sensors/data acquisition system (DAQ) system. The DAQ performs essential mathematical calculations. The sensor/DAQ system may consists of a DC voltage supply to various sensors, analog voltage measuring modules, display, transmitter, and receiver. In the first generation of the working prototype, the current sensor is connected in series and a voltage sensor is connected in parallel to the power supply as depicted in FIG. 3. The measured values of current, voltage and temperature are transmitted to the mobile phone or laptop using a wireless communication module which may be a Wifi or Bluetooth module.

Figure 4:
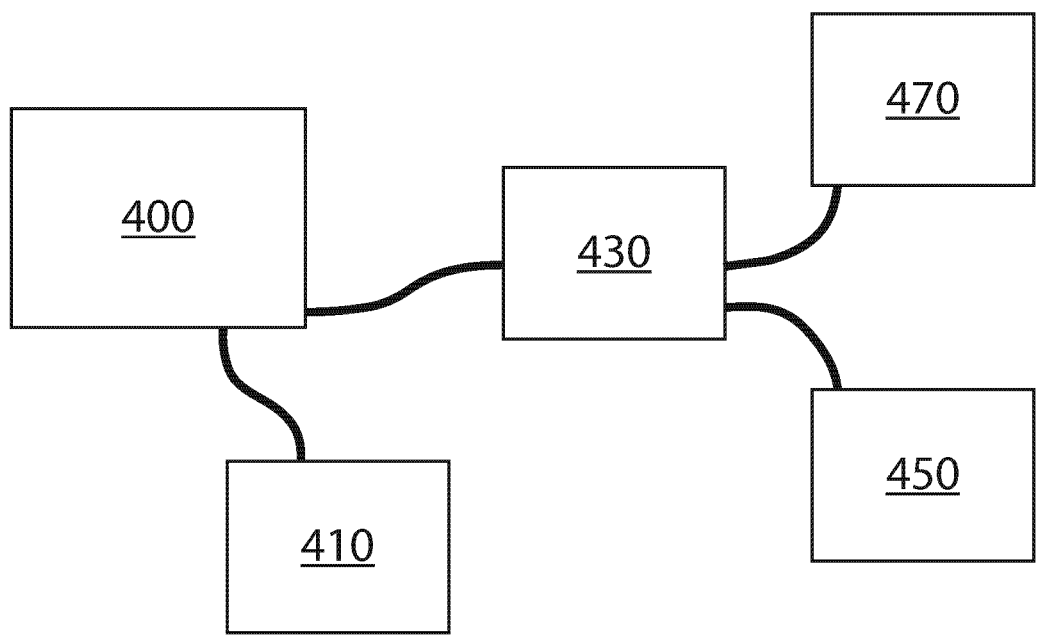
FIG. 4 shows a potential configuration for a damage evaluating system.

FIG. 4 depicts a potential configuration of the system for evaluating damage. Circuit board 400, which may be an Arduino board, is connected to a wireless local area network communication module 410 which allows remote acquisition of test data. Circuit board 400 is connected to Current and voltage sensing module 430 which is wired to both Power supply 450 and motor 470 enabling Current and voltage sensing module 430 to instantaneously monitor both the current and the voltage experienced by motor 470.

Performance data and statistics regarding estimated remaining useful life may be monitored via a smartphone for a single machine or for many machines.

The above-described methodology may determine the remaining useful life of components like gears, bearings, engine pistons, seals, etc. This method is not restricted to mechanical components as it can be applied to electronic components. The methodology does not require the changing of the existing machinery setups and creates a reliable and direct method for measuring damage and consumed useful life. The methods described herein may be implemented on new machinery or implemented into existing machines. The methods described herein may be particularly well-suited for machines that experience variable loading (stress) and variable speeds. The methods described herein may account for an arbitrarily varying operating conditions (duty cycle). This is particularly important for windmill applications where the gears and bearings can experience transient loads depending on the wind speed.

Embodiments described herein may be used in a great variety of machinery applications. Particular embodiments include testing instruments for use in industry, laboratories and academic environments. Embodiments may be used to evaluate coating life. A large variety of machines could be retrofitted to incorporate embodiments described herein and new machines may incorporate the embodiments described herein.

Second Example Set

By way of example, a damage rate having the dimensional characteristics of entropy may be calculated based on the following equation:

$$S = \frac{\text{Volt}(I_i - I_0)\cos\phi}{T} \quad (1)$$

where $I_i$ is the instantaneous value of the acquired current during the experiment, Volt is the voltage which is considered as a constant value of ~120 V, and $\phi$ represents the phase angle between the voltage and current waves. The phase angle $\phi$ can be determined by measuring the angle between the resistance R and impedance Z of the motor, as given in Eq. (2):

$$\phi = \cos^{-1}\left(\frac{R}{Z}\right) \quad (2)$$

The resistance of the motor may be determined by measuring the resistance of the winding using a digital multimeter and impedance may be calculated from the ratio of voltage and current consumed by the motor. $I_0$ is the current consumed by the setup without any load and is determined by operating the rig without any applied load. T is the temperature which can be determined by employing a thermocouple, an infra-red (IR) camera, or using the contact temperature equation (3).

$$T(t) = \left[T_0 + \frac{2Q}{(A_p(\rho_p C_p K_p)^{0.5} + A_d(\rho_d C_d K_d)^{0.5})}\left(\frac{t}{\pi}\right)^{0.5}\right] \quad (3)$$

where $T_0$ is the room temperature, $A_p$ and $A_d$ are the areas of the pin and the disk respectively, t is the time, $\rho$ is the density, c is the specific heat, and $\kappa$ thermal conductivity and subscript p and d refer to the pin and disk, respectively. Q is the total heat flow rate generated due to friction and is given as $Q=Q_p+Q_d$. $Q_p$ and $Q_d$ are the heat generated in pin and disk and given in Eq. (4) and Eq, (5), respectively.

$$Q_p = \left[\frac{(\rho_p C_p K_p)^{0.5} q A_p}{((\rho_p C_p K_p)^{0.5} + (\rho_d C_d K_d)^{0.5})}\right] \quad (4)$$

$$Q_d = \left[\frac{(\rho_d C_d K_d)^{0.5} q A_d}{((\rho_p C_p K_p)^{0.5} + (\rho_d C_d K_d)^{0.5})}\right] \quad (5)$$

In Eq. (4) and Eq. (5), q is heat generated per unit area and is determined as:

$$q = \frac{\mu N V}{A_p} \quad (6)$$

where $\mu$ is the coefficient of friction, V represents the sliding velocity, and N is the load.

By way of example, the useful life of a sliding pair can be determined by analogy to the first and second laws of thermodynamics. Here, the concept of the cumulative power is analogous to the first law of thermodynamics and a damage rate having the dimensional characteristics of entropy is analogous to the second law of thermodynamics. Calculations using these quantities may be used to determine the useful life of the component in question. The useful life through the cumulative power $P_{cumm}$ of the tribo-pair is constant for a given tribo-pair irrespective of their operating conditions or changes in load or speed that may occur during the operation. The application of the first law does not require the knowledge of entropy. The equation for determination of cumulative power using the first law thermodynamics is provided in Eq. (7).

$$P_{cumm} = \sum_{i=i}^{n} F_{\mu_i}(t) V_i(t) t_i \quad (7)$$

where $F_\mu(t)$ and $V(t)$ are the time variant friction force and sliding velocity, respectively. t is duration of the experiment and i is the "sequence" of the experiment in the case of variable loading, for example.

Figure 5:
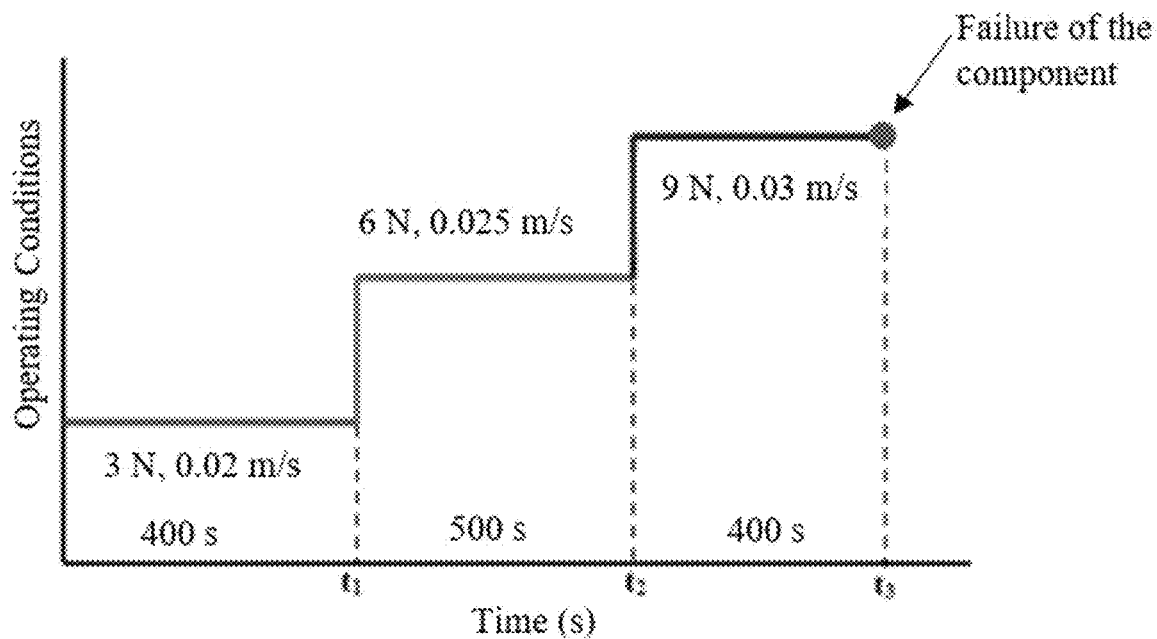
FIG. 5 shows the sequential operating conditions of a test on a tribo-pair.

As an example, a tribo-pair operating in three sequences and their respective operating conditions are shown in FIG. 5. FIG. 5 indicates the friction force, sliding speed and time of operation during each sequence. For simplicity, the values of friction coefficient and sliding speed are considered to be constant during each sequence. The calculation of cumulative power of the component is as follows $$P_{cumm}=3\times0.02\times400+6\times0.025\times500+9\times0.03\times400$$

$$P_{cumm}=222\text{J}$$

Figure 6:
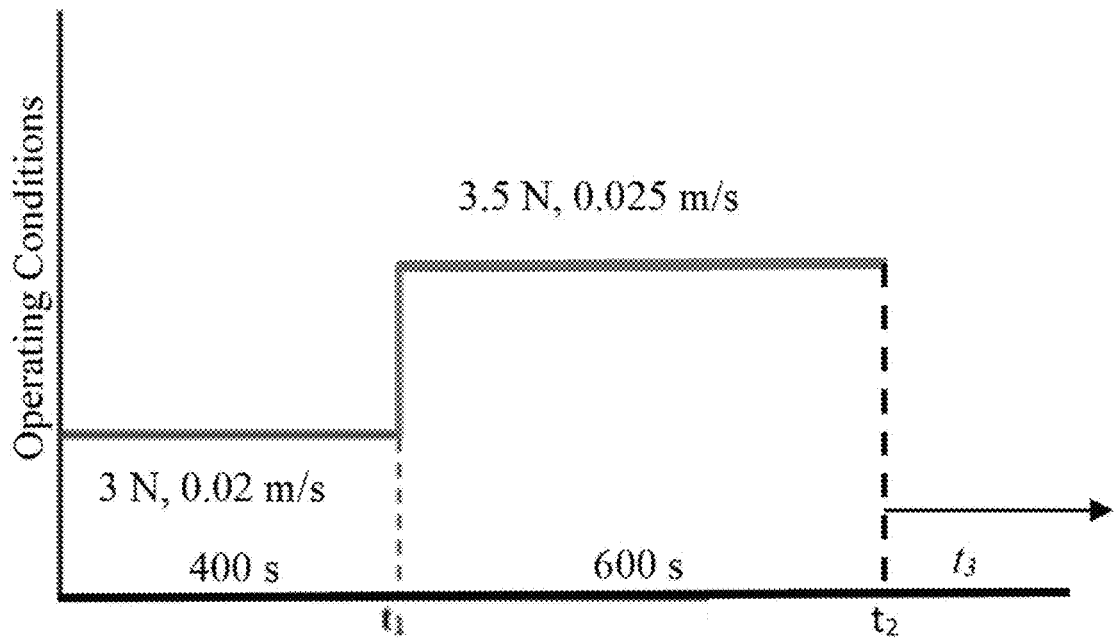
FIG. 6 shows the sequential operating conditions of a test on a tribo-pair.

Another example is depicted in FIG. 6. In the example associated with FIG. 6, the tribo-pair has operated for two sequences: 400 s at $F_\mu$=3 N and V=0.02 m/s and for 600 s at $F_\mu$=3.5 N and V=0.025 m/s. Sequence 2 is continued until the failure of the specimen. The cumulative power is constant irrespective of the operating conditions for a considered tribo-pair. So, for this case, the cumulative power to failure must be 222 J. Based on this criterion, the remaining useful life can be determined by:

$$222 = 3 \times 0.02 \times 400 + 3.5 \times 0.025 \times 600 + 3.5 \times 0.025 \times t$$

$$t = \frac{222 - 3 \times 0.02 \times 4000 + 3.5 \times 0.02 \times 600}{3.5 \times 0.025}$$

Useful life = $t$ = 1662.8 s

Therefore, after the second loading sequence, the remaining life is 662.8 s.

Accounting for temperature may yield more accurate estimations of useful life. The equation for determining the total damage based on the damage rate having the dimensional characteristics of entropy $S_{cumm}$ can be represented in Eq. (8).

$$S_{cumm} = \sum_{i=i}^{n} \frac{F_{\mu_i}(t)V_i(t)t_i}{T(t)} \quad (8)$$

Considering the contact temperature for sequences 1-3 as 300° C., 310° C. and 330° C., respectively, the cumulative damage is determined as $$S_{cumm} = \frac{3 \times 0.02 \times 400}{300} + \frac{6 \times 0.025 \times 500}{310} + \frac{9 \times 0.03 \times 400}{330}$$

$$S_{cumm} = 0.697 J/K$$

Considering the same example, the useful life of the tribe-pair using entropy type methodology is given by $$t = \frac{0.697 - \frac{3 \times 0.02 \times 400}{300} + \frac{3.5 \times 0.025 \times 600}{310}}{\frac{3.5 \times 0.025}{310}}$$

Useful life = $t$ = 1585 s

This provides a more conservative answer and can be implemented as an early warning signal to the user.

The cumulate damage of the tribo-pair using voltage, current, and temperature can be determined by $$S_{cumm} = \sum_{i=1}^{n} \frac{\text{Volt}(I_i(t) - I_0)\cos\phi_i(t)t_i}{T(t)} \quad (9)$$

Similarly, the instantaneous damage could be represented by $$D_i = \frac{\text{Volt}(I_i - I_0)\cos\phi_i}{T}$$

The value of voltage can be considered to be constant (120 V). The value of $I_0$ is determined by operating the tribometer apparatus at the desired sliding speed without any load. For calculating the value of $\phi_i$, the value of resistance and impedance is required. The value of resistance of the motor is determined using a multimeter and the value of impedance is determined from the ratio of voltage and instantaneous current value.

$$\phi = \cos^{-1}\left(\frac{RI_i(t)}{\text{Volt}}\right) \quad (10)$$

Figure 7:
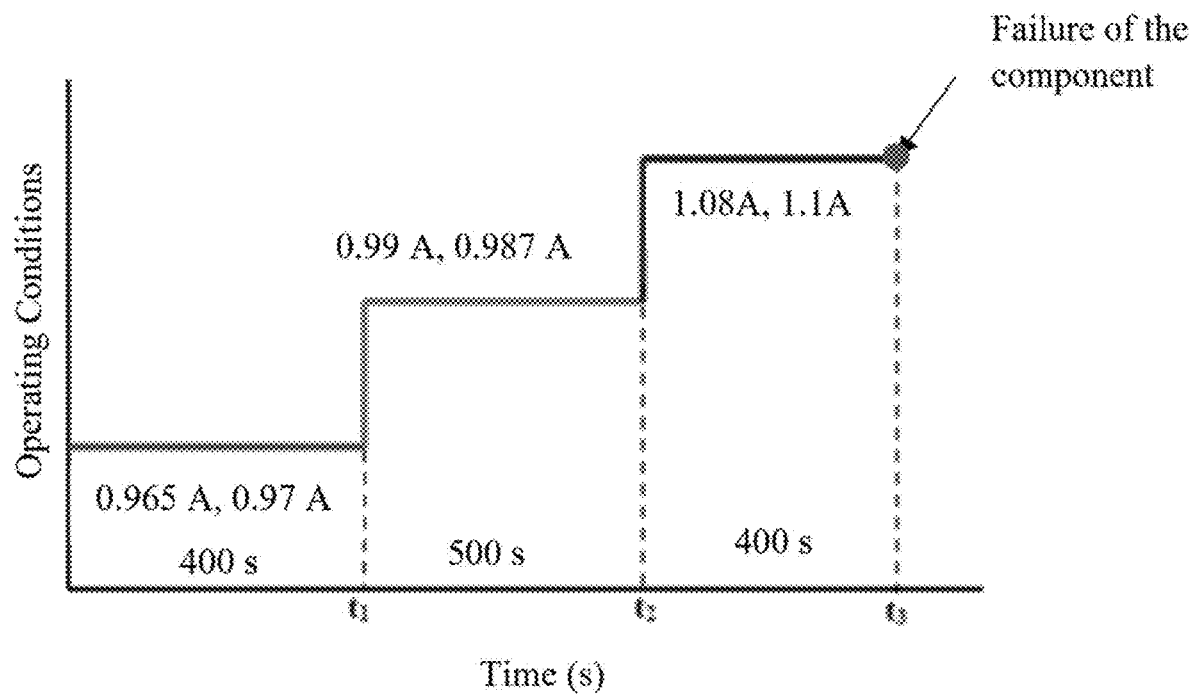
FIG. 7 shows the sequential operating conditions of a test on a tribo-pair.

In another example, the resistance of the tribometer is 18 Ω and the value of $I_0$ and $I_i$ are provided in FIG. 7.

$$S_{cumm} = \frac{123 \times (0.97 - 0.965) \times (0.1447 \times 400)}{300} +$$
$$\frac{123 \times (0.987 - 0.99) \times 0.176 \times 500}{310} + \frac{123 \times (1.1 - 1.08) \times 0.205 \times 400}{330}$$

$$S_{cumm} = 0.68 J/K$$

Figure 8:
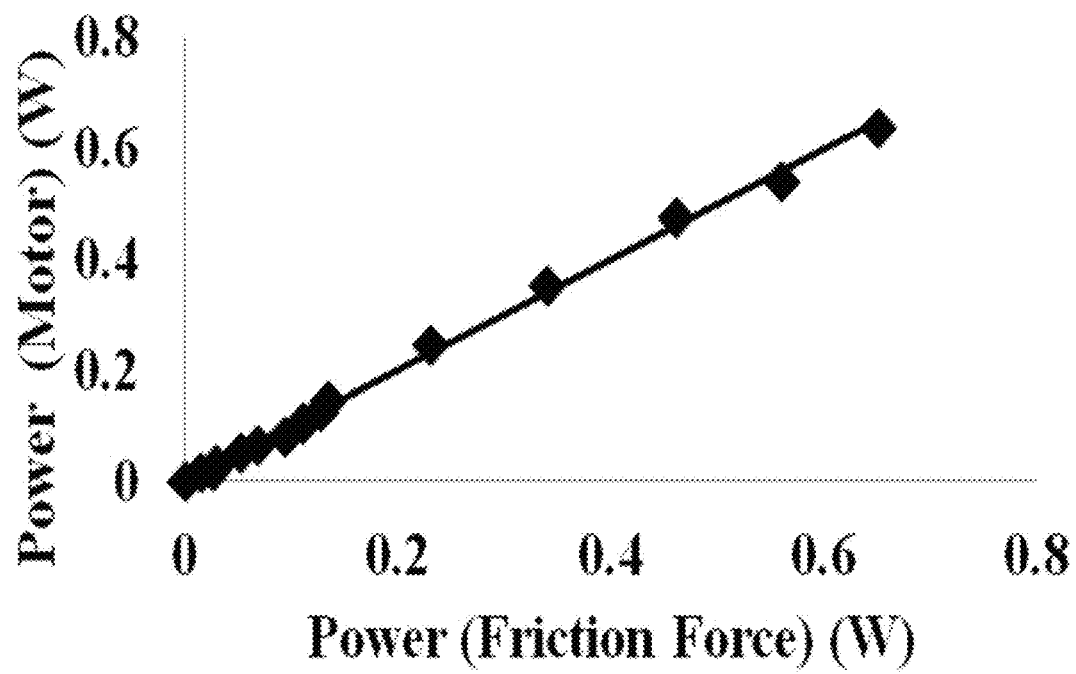
FIG. 8 depicts a plot of motor power against friction force.

Following the procedure above, the useful life can be determined. From a series of experiments, it has been observed that power consumed by the motor during the experiment is proportional to the frictional force experienced by the contact of the pin and the sliding disk. The plot between the friction force and motor power is provided in FIG. 8.

The following steps may take place on a computer or other processing device in furtherance of the methods described herein. Inputs such as material properties, the resistance of the motor, voltage, initial current values, ambient temperature and useful life of the tribo-pair may be tracked. The values of the temperature from a thermocouple or any other type of temperature sensor may be provided as input. If such temperature data is not available, the value of the contact temperature is determined using a contact temperature equation. The value $\cos \phi_i(t)$ may be determined from the instantaneous values of current, resistance and voltage. Then the value of $$S_{cumm} = \frac{\text{Volt}(I_i(t) - I_0)\cos\phi_i(t)}{T(t)}$$

may be calculated.

The remaining life may be calculated from:

$$t = S_{cumm} - \sum_{i=1}^{n} \frac{\text{Volt}(I_i(t) - I_0)\cos\phi_i(t)t_i}{T(t)}$$

The computer or other processing device may provide the real-time plot of the instantaneous power and entropy values in a mobile phone or any other display as needed for monitoring purposes. Values representing the remaining useful life may be sent to the mobile phone and email of the user. A warning signal may be sent when the remaining life of a tribo-pair is closer to the useful life.

Third Example Set

Examples of equipment for which the methods described herein may be used include bearings such as ball bearings, roller bearings and journal bearings along with various types of seals.

Figure 9:
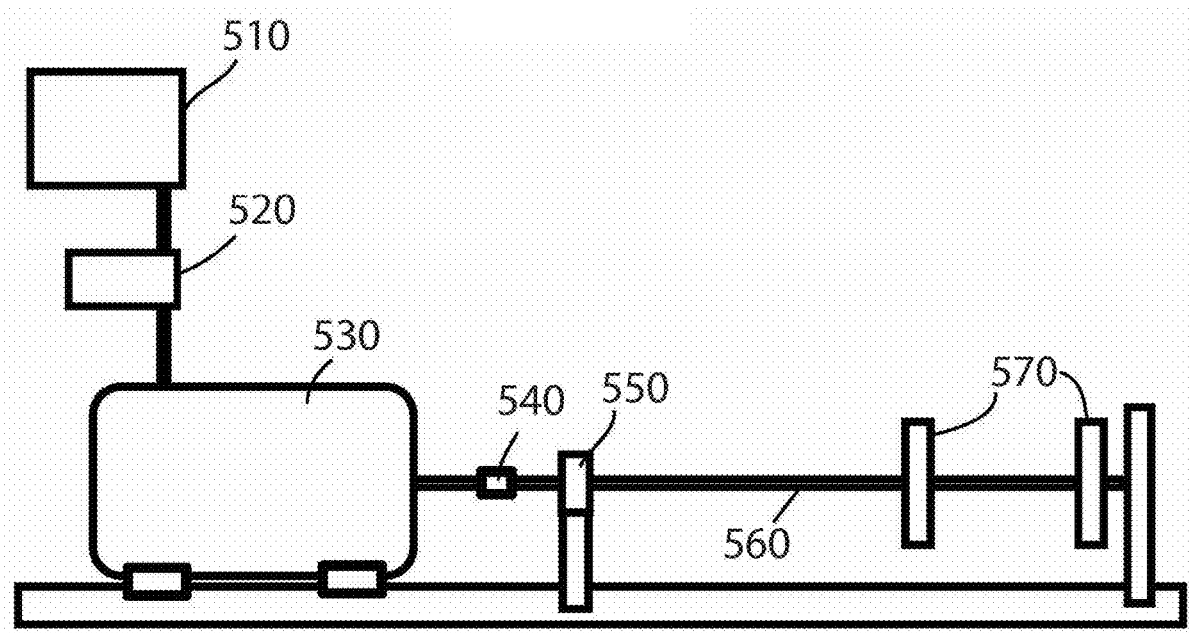
FIG. 9 depicts an experimental set up for evaluating useful life.

To demonstrate the application of the developed technology in determining the useful life, consider a setup shown in FIG. 9. This setup consists of a Friction unit 550, an AC motor 530 and unbalanced disks 570 that impart imbalance on the friction unit. Friction unit 550 may be either a bearing or a seal. In the case that Friction unit 550 is a bearing, that bearing may take one of the known types of bearings including ball, roller, and journal. To measure the power drawn by AC motor 530, a Damage tracking device 520 as described herein is connected between the AC power supply 510 and AC motor 530. When the bearing or seal experiences the imbalance developed by Unbalanced disks 570, these components induce load on Rotating steel shaft 560 and in-turn AC motor 530 draws more power to maintain the rotational speed. Rotating steel shaft 560 is connected to AC motor 530 by Flexible coupling 540. The Damage tracking device 520 records these variations through power values and the algorithm in Damage tracking device 520 calculates the remaining useful power to failure. The continuous degradation of these components may increase the power drawn by AC motor 530.

The accuracy and reliability in the determination of the remaining useful life by the device can be enhanced by estimating the accumulated damage based on a damage rate having the dimensional characteristics of entropy. This involves the determination of the power along with measurement of the operating temperature of the bearing or seals though thermocouple or IR camera or theoretical models. If the values of accumulative power or accumulative entropy generation or instant value of power crosses the reference value, the information will be forecasted to the mobile/laptop. This design is not restricted to a given operating condition and accommodates any changes that can occur, i.e. variable duty cycle. The importance of the duty cycle is illustrated in the next application example.

Another example of a potential use for the methods described herein is the gearbox and bearings of a windmill. In windmills the blades are rotated by the wind and in-turn generate power using the generator. The windmill blade is connected to the generator through the main bearing and a gearbox. The operating condition is totally unpredictable as it depends on the wind speed which can vary widely during the day and seasonally. Failure of a bearing or gears in a windmill can be extremely costly to replace due to their elevation, which requires commissioning a crane at the typical cost of roughly $500K to $1M per day if the unit is located on an offshore platform.

Figure 10:
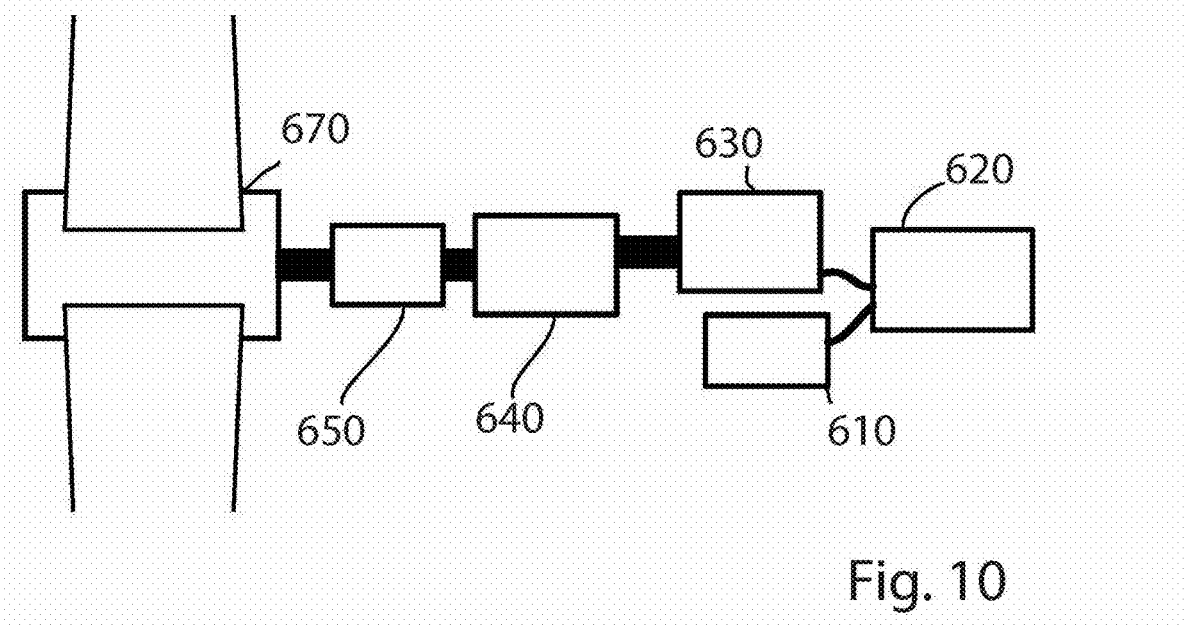
FIG. 10 depicts a damage assessment module applied to a windmill.

The generated power from the generator may be sent to the main power station through the control cabinet. Equipment utilizing the methods described herein may be connected between the generator and control cabinet to monitor performance and guard against premature failure. FIG. 10 shows an example configuration of how the damage evaluation device may be applied to a windmill. Power generated by the windmill may be calculated from the measured current and voltage which are speed dependent and may be evaluated in a number of ways so that instantaneous and cumulative damage may be calculated. Power at time t=0 (let us denote by $P_0$), may be evaluated by running Generator 630 either as a motor or as a generator. Evaluations of $P_0$ may be done in a controlled environment such as a lab or with completed field installations. Evaluations of $P_0$ will generally involve operations at enough different speeds and conditions to determine the full speed dependency of $P_0$ and those variations may simulate a duty cycle of the installed equipment. In the example depicted in FIG. 10, the measurements used to determine $P_0$ may also be based on initial operation and duty cycle of the equipment to be monitored by Damage evaluation device 620. $P_0$ as measured during the first operating conditions provides the information on the friction resistance imparted by the components, like Gearbox 640, Main bearing 650, etc., in the pristine unloaded condition. Those conditions evaluated as best representing pristine unloaded conditions may be used to determine $P_0$. Initial data to establish the speed dependent values of $P_0$ may be established by powering Generator 630 as a motor through a simulated duty cycle or by gathering data as Generator 630 generates power during the duty cycle associated with initial operations of the equipment. In operation, the power to Control cabinet 610 from Generator 630 due to the rotation of Hub and blades 670 are evaluated using the Damage evaluation device 620. Temperature may be measured or estimated, and damage or cumulative entropy may be assessed.

Power at a particular time t may be evaluated using the equation:

$$P(t) = V(I(t) - I_0)\cos\phi(t)$$

Cumulative power for n duty cycles, where $t_i$ represents the time duration for each duty cycles may be evaluated using the equation:

$$P_{cumm} = \sum_{i=1}^{n} V(I_i(t) - I_0)\cos\phi_i(t)t_i$$

Cumulative power for random variation may be evaluated using the equation:

$$P_{cumm} \int_0^t V(I(t) - I_0)\cos\phi(t)dt$$

Entropy at a particular time t may be evaluated using the equation:

$$S(t) = \frac{V(I(t) - I_0)\cos\phi(t)}{T(t)}$$

Cumulative entropy for n duty cycles may be evaluated using the equation:

$$S_{cumm} = \sum_{i=1}^{n} \frac{V(I_i(t) - I_0)\cos\phi_i(t)t_i}{T_i(t)}$$

Cumulative entropy for random variation may be evaluated using the equation:

$$S_{cumm} = \int_0^t \frac{V(I(t) - I_0)\cos\phi(t)}{T_i(t)} dt$$

Accordingly, instantaneous damage may be evaluated based on the methods described herein as having either the dimensional form $$\frac{Mass * Length^2}{time^3 * Temperature}$$

if temperature is used or $$\frac{Mass * Length^2}{time^3}$$

if temperature is not used. Cumulative damage may be evaluated based on the methods described herein as having either the dimensional form $$\frac{Mass * Length^2}{time^2 * Temperature}$$

if temperature is used or $$\frac{Mass * Length^2}{time^2}$$

if temperature is not used.

The power and/or entropy measured during the first operating condition provides the information on the friction resistance imparted by the components, like Gearbox 640, Main bearing 650, etc., in the pristine condition. The power/entropy values during the later operational conditions measure the imbalance on Generator 630 and the components degradation, along with the friction resistance. Consequently, the calculated difference of power and/or entropy values will provide the information on the imbalance and degradation experienced by the components. Based on the determined differences, the user can decide on the scheduling of inspection and/or maintenance of the windmill.

The load imparted onto the components, namely Gearbox 640 and Main bearing 650 or any imbalance on Generator 630 can be recorded by Damage evaluation device 620. A user may be notified in the case of a looming failure. Furthermore, with the availability of temperature via a sensor or by means of simple estimation, Damage evaluation device 620 can determine a value associated with the system entropy and predict the remaining useful life.

Figure 11:
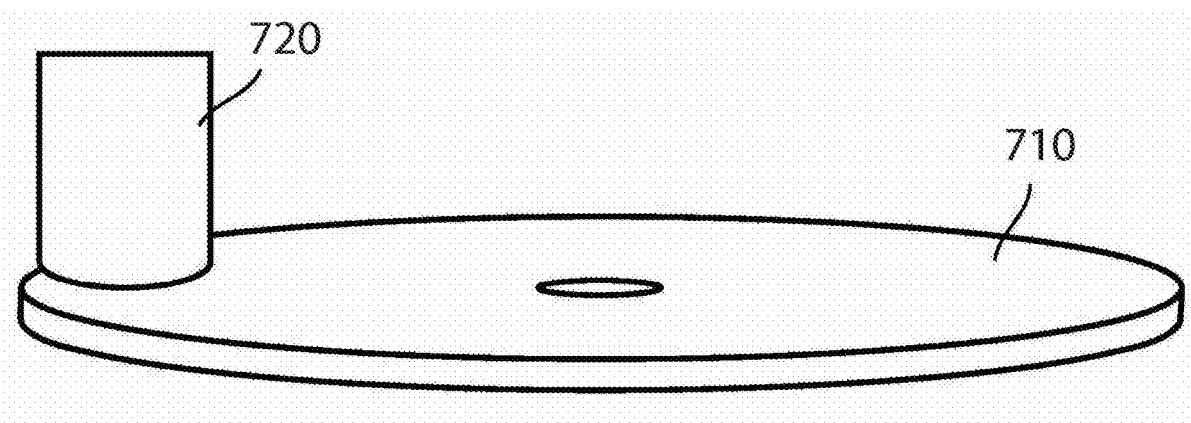
FIG. 11 depicts a testing apparatus for measuring coating damage.

Many sensitive machine components use a coating on their surfaces. The coatings can be soft to reduce the coefficient of friction; such as a Babbitt, a white metal used in bearings; or hard coatings used in drill bits and excavating machines to protect life. Material degradation due to wear can reduce the coating thickness and endanger the health of the machine. Instruments and components incorporating the methods described herein can be used to alert the user to halt a machine's operation before failure sets in. This is significant because premature failure can result in a forced shutdown and the associated loss in productivity. FIG. 11 depicts a Spinning metal disk 710 having a coating. The Spinning metal disk 710 may be engaged in frictional contact with a Metal pin 720. The methodology of other described examples would apply to this type of testing arrangement to evaluate and predict failure of the coating.

Following the above procedure, the failure of any tool during their machining process can be determined. Machining the parts with a failed tool, delivers inaccurate product and takes more time for machining. Therefore, it is necessary for the worker to determine the occurrence of tool failure and its timely replacement or repair. When the tool loses its functionality, it induces more friction on the machining material and in turn affects the power drawn by the driving motor and the operating temperature increases with the associated entropic disorder. Therefore, by monitoring the power drawn by the motor and entropy generation by employing contact temperature, implementation of the described embodiments will enable the user to take precautionary action to guard against failure.

Methods of estimating tribological damage described herein may, for example, comprise engaging a first surface in frictional contact with a second surface; operating the first surface and the second surface relative to one another under conditions such that a surface friction power associated with a contact area between the first surface and the second surface varies with time; calculating a value representing the surface friction power; determining a temperature value representing a temperature of the first surface at a contact point between the first surface and the second surface; determining an instantaneous damage rate that is a first quantity having the dimensional form:

$$\frac{Mass * Length^2}{time^3 * Temperature}$$

and tracking a quantity of accumulated damage wherein the quantity of accumulated damage is a second quantity having the dimensional form:

$$\frac{Mass * Length^2}{time^2 * Temperature}.$$

In a related example, the instantaneous damage rate may be calculated using a measured voltage and a measured current. In a related example, the instantaneous damage rate may be calculated using a measured temperature. In a related example, the instantaneous damage rate may be calculated using an estimated temperature. In a related example, a motor may be driving a surface selected from the first surface and the second surface and the instantaneous damage rate may be calculated using a motor voltage associated with the motor and a motor current associated with the motor. In a related example, an electric generator may be driven such that a surface selected from the first surface and the second surface is driven and the instantaneous damage rate may be calculated using an electric generator voltage associated with the electric generator and an electric generator current associated with the electric generator. In a related example, a motor may drive a surface selected from the first surface and the second surface and a value representing the surface friction power may be calculated using an applied load between the first surface and the second surface and a sliding speed between the first surface and the second surface.

Methods of estimating tribological damage described herein may, for example, comprise engaging a first surface in frictional contact with a second surface; operating the first surface and the second surface relative to one another under conditions such that a surface friction power associated with a contact area between the first surface and the second surface varies with time; calculating a value representing the surface friction power; determining an instantaneous damage rate that is a quantity having the dimensional form:

$$\frac{Mass * Length^2}{time^3}$$

and tracking a quantity of accumulated damage wherein the quantity of accumulated damage is a quantity having the dimensional form:

$$\frac{\text{Mass} * \text{Length}^2}{\text{time}^2}.$$

In a related example, a motor may be driving a surface selected from the first surface and the second surface and a value representing the surface friction power is calculated using a motor voltage associated with the motor and a motor current associated with the motor. In a related example, an electric generator may be driven such that a surface selected from the first surface and the second surface is driven and a value representing the surface friction power is calculated using an electric generator voltage associated with the electric generator and an electric generator current associated with the electric generator. In a related example, a motor may drive a surface selected from the first surface and the second surface and a value representing the surface friction power is calculated using an applied load between the first surface and the second surface and a sliding speed between the first surface and the second surface.

As that term is used herein, "surface friction power" represents the instantaneous rate of energy consumption by two surfaces engaged in frictional contact as a direct result of that frictional contact. For example, the surface friction power of a pump seal would account only for the instantaneous rate of energy consumption at the pump seal surfaces and not include any power utilized to drive the pump impeller.

The above-described embodiments have a number of independently useful individual features that have particular utility when used in combination with one another including combinations of features from embodiments described separately. There are, of course, other alternate embodiments which are obvious from the foregoing descriptions, which are intended to be included within the scope of the present application.

We claim:

1. A method of estimating tribological damage comprising:
   a. operating a motor driving frictional contact between a first surface and a second surface under conditions such that a surface friction power associated with a contact area between the first surface and the second surface varies with time;
   b. calculating a value representing the surface friction power as a difference between an instantaneous power of the motor under load and a power of the motor from a prior operational condition;
   c. wherein the instantaneous power of the motor under load is determined from a voltage applied to the motor under load and a current through the motor under load;
   d. determining a temperature value representing a temperature of the first surface at a contact point between the first surface and the second surface;
   e. determining an instantaneous damage rate that is a first quantity $$\frac{\text{Mass} * \text{Length}^2}{\text{time}^3 * \text{Temperature}}$$

having the dimensional form from the value representing the surface friction power and the temperature value; and
   f. tracking a quantity of accumulated damage calculated from the instantaneous damage rate wherein the quantity of accumulated damage is a second quantity having the dimensional form:

$$\frac{\text{Mass} * \text{Length}^2}{\text{time}^2 * \text{Temperature}};$$

and
   g. replacing a surface selected from the first surface and the second surface based on the quantity of accumulated damage.

2. The method of claim 1 wherein the instantaneous damage rate is calculated using a measured voltage and a measured current.

3. The method of claim 1 wherein the instantaneous damage rate is calculated using a measured temperature.

4. The method of claim 1 wherein the instantaneous damage rate is calculated using an estimated temperature.

5. The method of claim 1 wherein the quantity of accumulated $$\frac{\text{Energy}}{\text{Temperature}}.$$

damage has units of.

6. The method of claim 1 wherein the power of the motor from a prior operational condition is at a lower load than the instantaneous power of the motor under load.

7. The method of claim 1 wherein the power of the motor from a prior operational condition is a power associated with a no load condition.

8. A method of estimating tribological damage comprising:
   a. operating a motor driving frictional contact between a first surface and a second surface under conditions such that a surface friction power associated with a contact area between the first surface and the second surface varies with time;
   b. calculating a value representing the surface friction power as a difference between an instantaneous power of the motor under load and a power of the motor from a prior operational condition;
   c. wherein the instantaneous power of the motor under load is determined from a voltage applied to the motor under load and a current through the motor under load;
   d. determining an instantaneous damage rate that is a quantity $$\frac{\text{Mass} * \text{Length}^2}{\text{time}^3}$$

having the dimensional form from the value representing the surface friction power; and
   e. tracking a quantity of accumulated damage from the value representing the surface friction power wherein the quantity of accumulated damage is a quantity having the dimensional form:

$$\frac{\text{Mass} * \text{Length}^2}{\text{time}^2}.$$

and
   f. replacing a surface selected from the first surface and the second surface based on the quantity of accumulated damage.

9. The method of claim 8 wherein the quantity of accumulated damage has units of energy.

10. A method of estimating tribological damage comprising:
   a. driving both an electric generator and frictional contact between a first surface and a second surface under conditions such that a surface friction power associated with a contact area between the first surface and the second surface varies with time;
   b. calculating a value representing the surface friction power as a difference between an instantaneous power of the electric generator under load and a power of the electric generator from a prior operational condition;
   c. wherein the instantaneous power of the electric generator under load is determined from a voltage generated by the electric generator under load and a current through the electric generator under load;
   d. determining a temperature value representing a temperature of the first surface at a contact point between the first surface and the second surface;
   e. determining an instantaneous damage rate that is a first quantity $$\frac{Mass * Length^2}{time^3 * Temperature}$$

having the dimensional form from the value representing the surface friction power and the temperature value; and
   f. tracking a quantity of accumulated damage calculated from the instantaneous damage rate wherein the quantity of accumulated damage is a second quantity having the dimensional form $$\frac{Mass * Length^2}{time^2 * Temperature};$$

and
   g. replacing a surface selected from the first surface and the second surface based on the quantity of accumulated damage.

11. The method of claim 10 further comprising the steps of measuring current through the electric generator under load and measuring voltage generated by the electric generator under load for the calculation of the instantaneous damage rate.

12. The method of claim 10 wherein the instantaneous damage rate is calculated using a measured temperature.

13. The method of claim 10 wherein the instantaneous damage rate is calculated using an estimated temperature.

14. The method of claim 10 wherein the quantity of accumulated $$\frac{Energy}{Temperature}.$$

damage has units of.

* * * * *

UNITED STATES PATENT AND TRADEMARK OFFICE
CERTIFICATE OF CORRECTION

PATENT NO. : 11,488,420 B2
APPLICATION NO. : 16/887330
DATED : November 1, 2022
INVENTOR(S) : Michael Khonsari and Lijesh Koottaparambil It is certified that error appears in the above-identified patent and that said Letters Patent is hereby corrected as shown below:

In the Claims

In Column 11 Lines 58-67 reciting claim element "e" of Claim 1 the formula is misplaced such that it incorrectly reads:
"e. determining an instantaneous damage rate that is a first quantity ((Mass * Length^2) / (time^3 * Temperature)) having the dimensional form from the value representing the surface friction power and the temperature value; and".
The lines should read:
--e. determining an instantaneous damage rate that is a first quantity having the dimensional form
$$\frac{Mass * Length^2}{time^3 * Temperature}$$
from the value representing the surface friction power and the temperature value; and--.

In Column 12 Lines 21-28 reciting Claim 5 the formula is misplaced such that it incorrectly reads:
"5. The method of Claim 1 wherein the quantity of accumulated Energy/Temperature. damage has units of"
The lines should read:
--5. The method of Claim 1 wherein the quantity of accumulated damage has units of $\frac{Energy}{Temperature}$--.

In Column 12 Lines 49-57 reciting element "d" of Claim 8 the formula is misplaced such that it incorrectly reads:
"d. determining an instantaneous damage rate that is a quantity ((Mass * Length^2) / (time^3)) having the dimensional form from the value representing the surface friction power; and"
The lines should read:
--d. determining an instantaneous damage rate that is a quantity having the dimensional form
$$\frac{Mass * Length^2}{time^3}$$

Signed and Sealed this
Fourth Day of April, 2023

Katherine Kelly Vidal
*Director of the United States Patent and Trademark Office* from the value representing the surface friction power; and--.

In Columns 13 and 14 from Column 13 Line 26 to Column 14 Line 2, in the recitation of claim element "e" of Claim 10 the formula is misplaced such that it incorrectly reads:
"e. determining an instantaneous damage rate that is a first quantity ((Mass * Length^2) / (time^3 * Temperature)) having the dimensional form from the value representing the surface friction power and the temperature value; and".
The lines should read:
--e. determining an instantaneous damage rate that is a first quantity having the dimensional form
$$\frac{Mass * Length^2}{time^3 * Temperature}$$
from the value representing the surface friction power and the temperature value; and--.

In Column 14 Lines 25-32 reciting Claim 14 the formula is misplaced such that it incorrectly reads:
"14. The method of Claim 10 wherein the quantity of accumulated Energy/Temperature. damage has units of."
The lines should read:
--14. The method of Claim 10 wherein the quantity of accumulated damage has units of
$$\frac{Energy}{Temperature}.$$
--.